United States Patent
Kim et al.

(10) Patent No.: US 12,444,639 B2
(45) Date of Patent: Oct. 14, 2025

(54) SEMICONDUCTOR DEVICE AND METHOD FOR REDUCING METAL BURRS USING LASER GROOVING

(71) Applicant: STATS ChipPAC Pte. Ltd., Singapore (SG)

(72) Inventors: ChangOh Kim, Incheon (KR); JinHee Jung, Incheon (KR); DaePark Lee, Gyeonggi-do (KR); YoungKang Lee, Incheon (KR); YongJin Jeong, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 170 days.

(21) Appl. No.: 17/457,074

(22) Filed: Dec. 1, 2021

(65) Prior Publication Data
US 2023/0170245 A1 Jun. 1, 2023

(51) Int. Cl.
*H01L 21/683* (2006.01)
*H01L 21/48* (2006.01)
*H01L 23/552* (2006.01)

(52) U.S. Cl.
CPC ...... *H01L 21/6836* (2013.01); *H01L 21/4814* (2013.01); *H01L 23/552* (2013.01)

(58) Field of Classification Search
CPC ... H01L 23/552; H01L 25/16; H01L 23/3128; H01L 21/4814; H01L 23/66; H01L 21/6836
See application file for complete search history.

(56) References Cited

U.S. PATENT DOCUMENTS

| | | | |
|---|---|---|---|
| 8,378,466 B2 | 2/2013 | Chiu et al. | |
| 10,109,593 B2 | 10/2018 | Lee et al. | |
| 2013/0217184 A1* | 8/2013 | Ishizuki | H01L 24/19 438/118 |
| 2013/0294034 A1* | 11/2013 | Kanryo | H01L 21/568 29/841 |
| 2017/0005062 A1* | 1/2017 | Azuma | H01L 21/6836 |
| 2017/0221836 A1* | 8/2017 | Nguyen | H01L 21/2855 |
| 2018/0294236 A1 | 10/2018 | Han et al. | |
| 2018/0308756 A1* | 10/2018 | Kim | H01L 21/78 |
| 2019/0304927 A1* | 10/2019 | Kim | H01L 21/683 |
| 2022/0199423 A1* | 6/2022 | Kim | H01L 23/49838 |

* cited by examiner

*Primary Examiner* — Brian Turner
(74) *Attorney, Agent, or Firm* — Brian M. Kaufman; Robert D. Atkins; Atkins and Associates, P.C.

(57) ABSTRACT

A semiconductor device is formed using a jig. The jig includes a metal frame, a polymer film, and an adhesive layer disposed between the metal frame and polymer film. An opening is formed through the adhesive layer and polymer film. A groove is formed around the opening. A semiconductor package is disposed on the jig over the opening with a side surface of the semiconductor package adjacent to the groove. A shielding layer is formed over the semiconductor package and jig. The semiconductor package is removed from the jig.

22 Claims, 12 Drawing Sheets

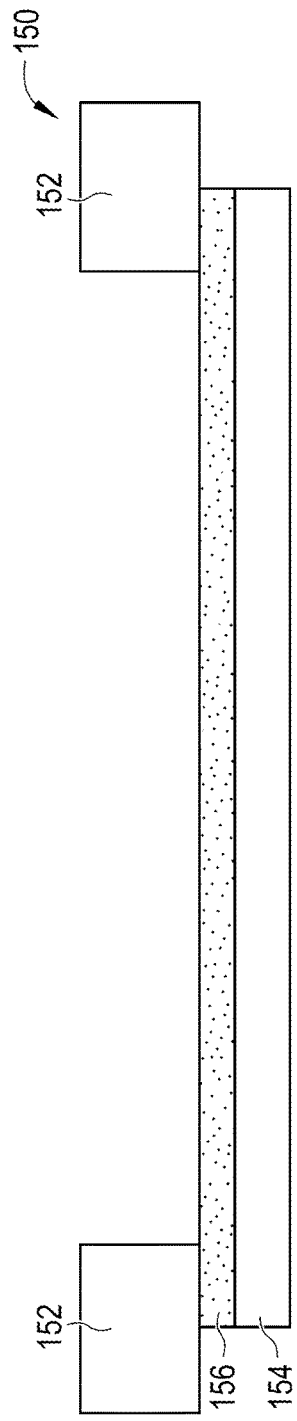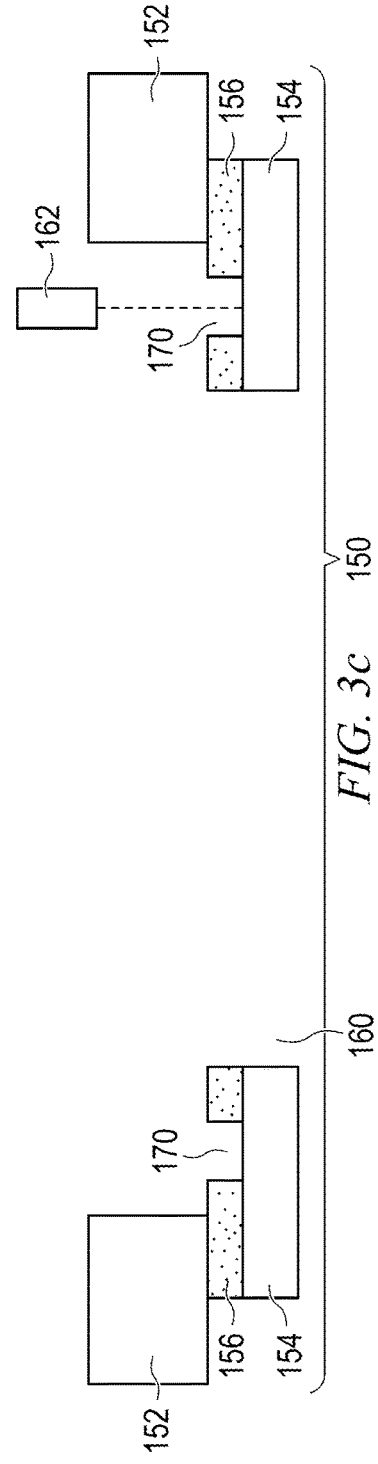

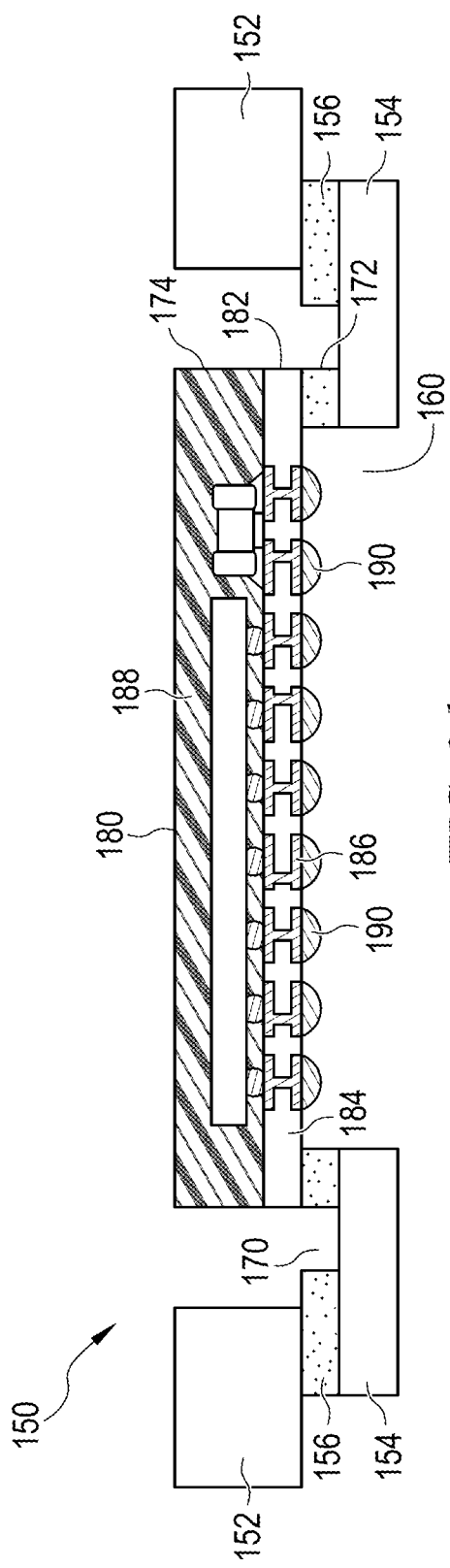
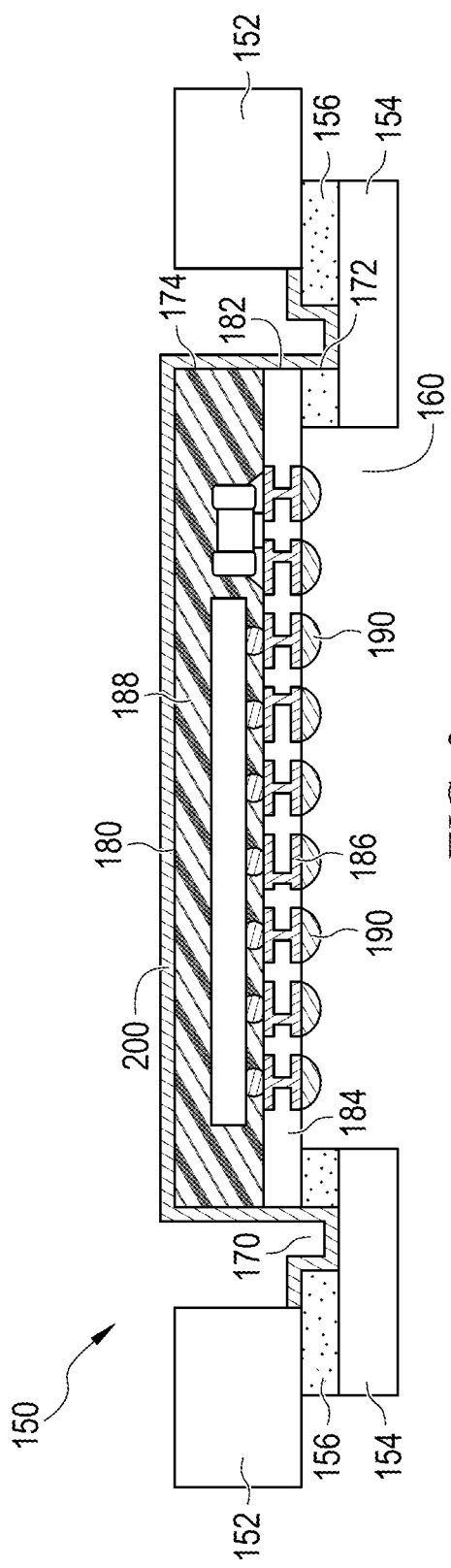

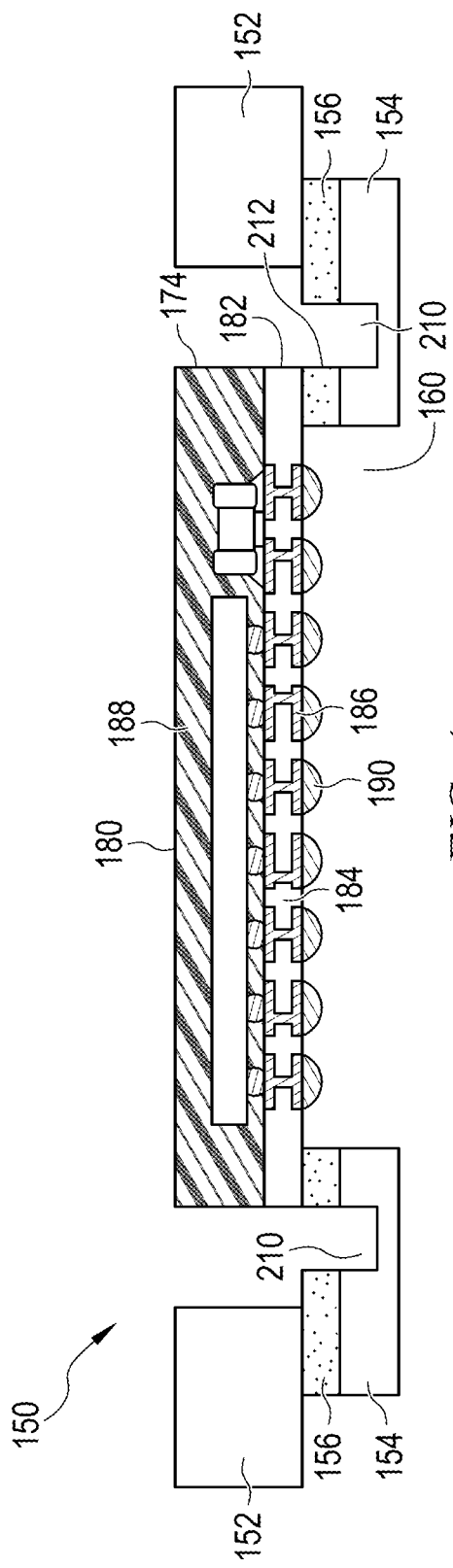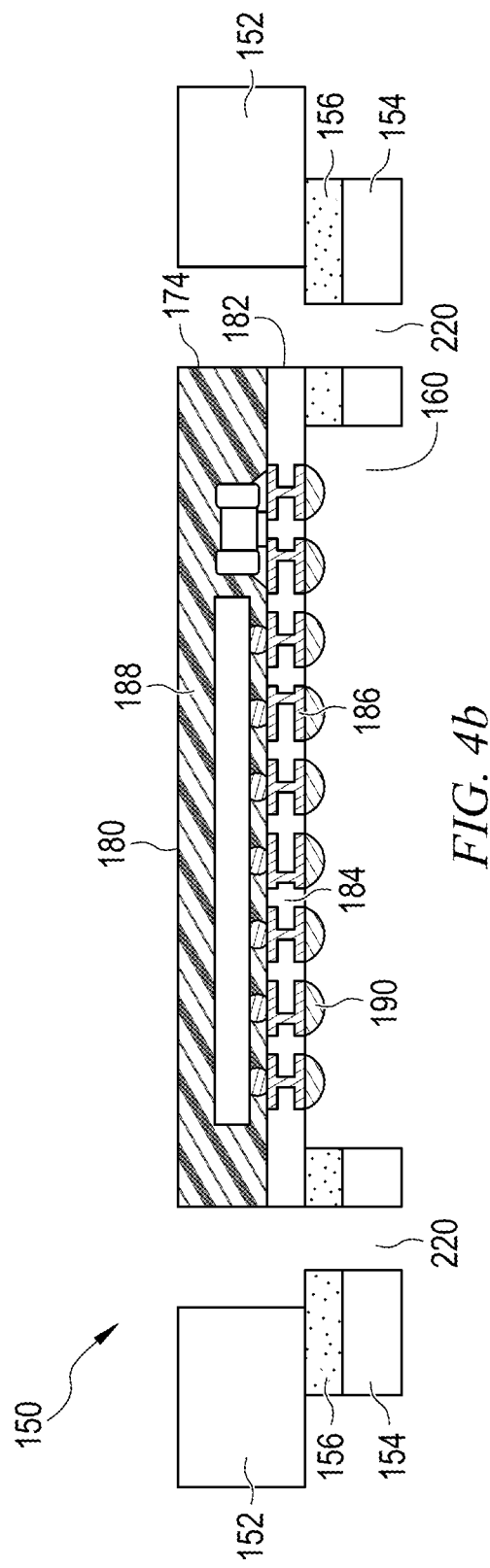

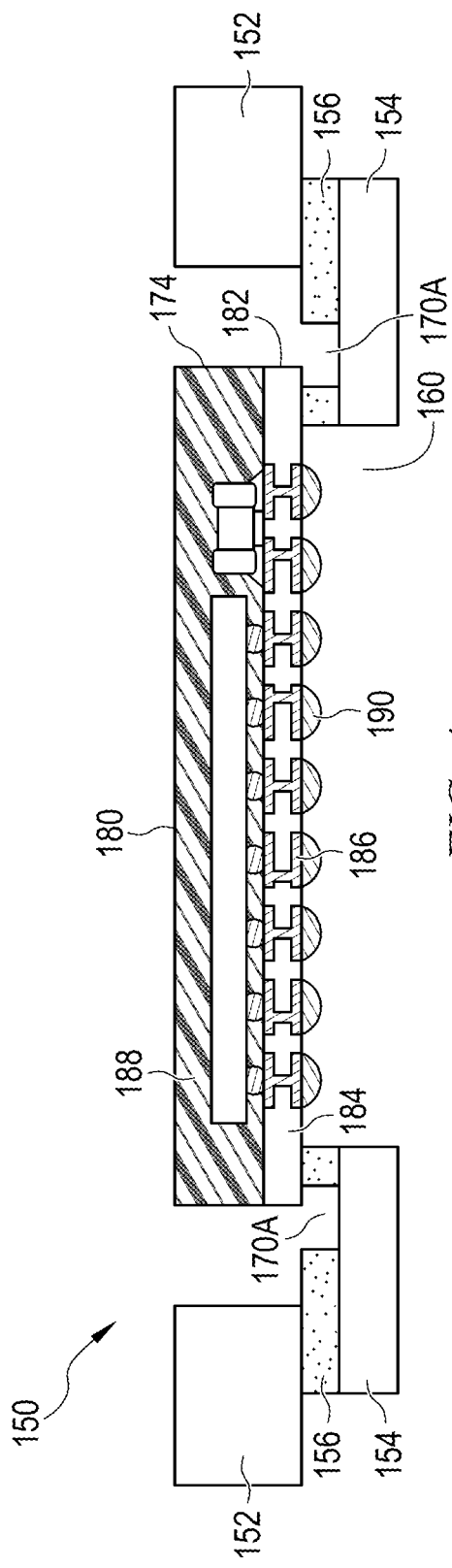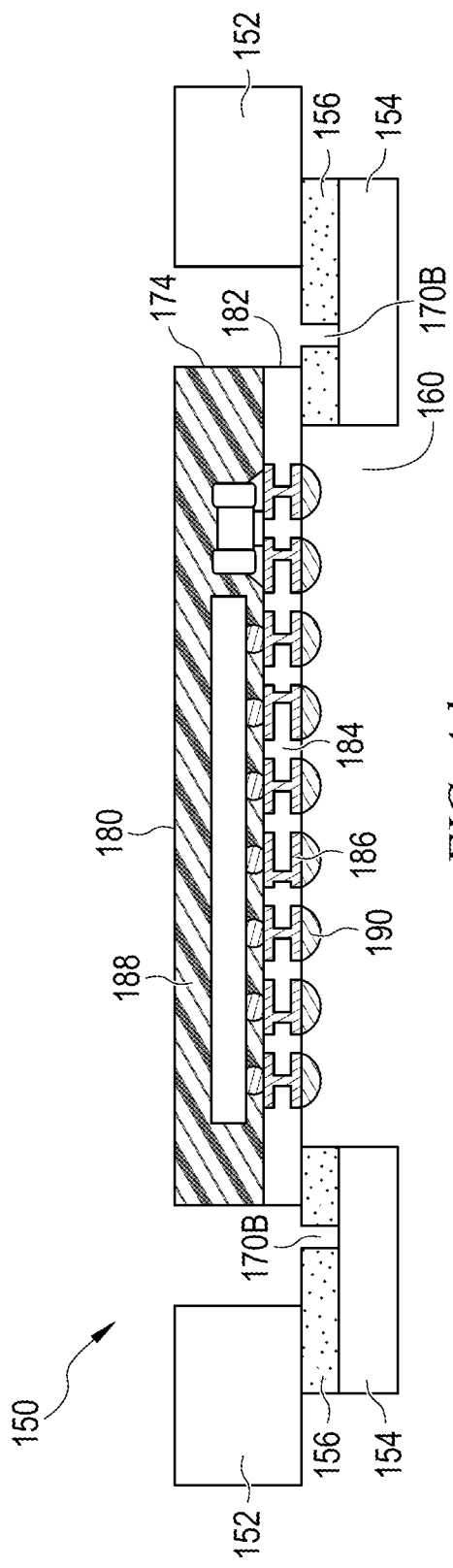

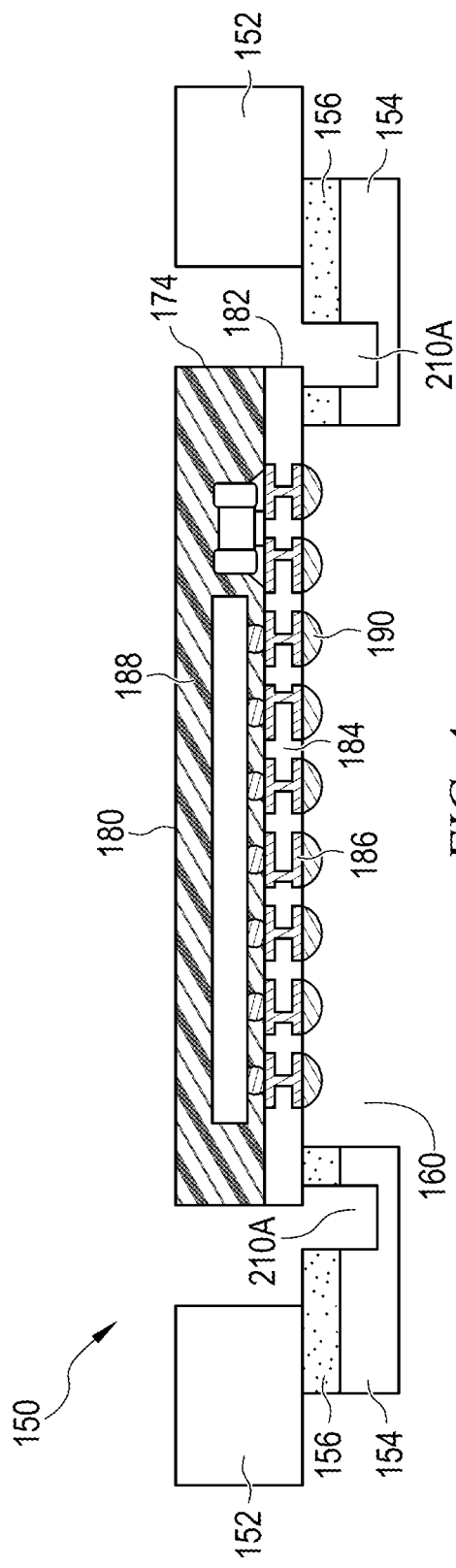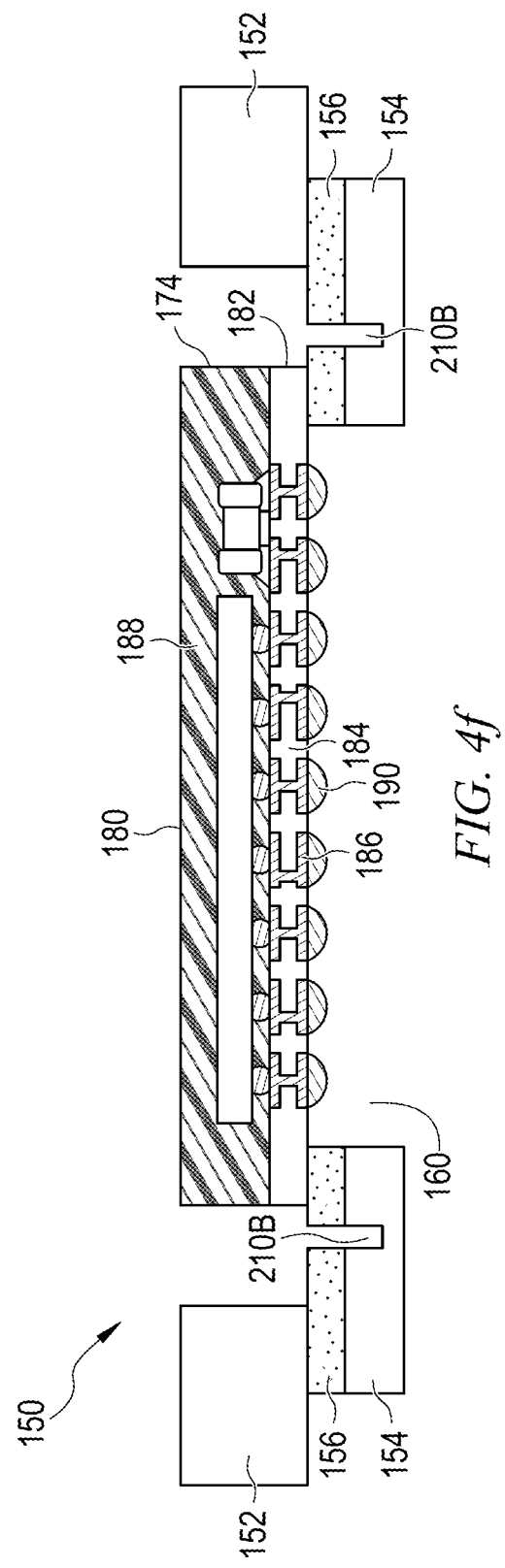

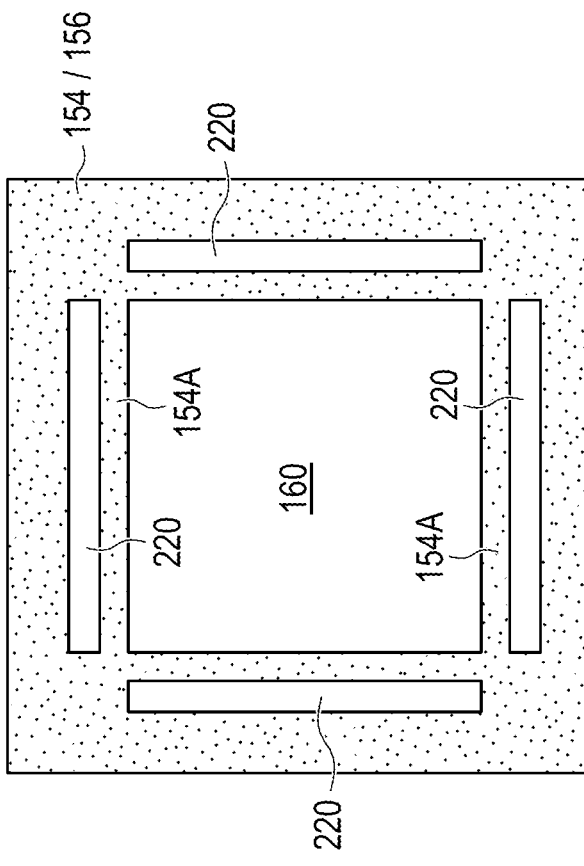
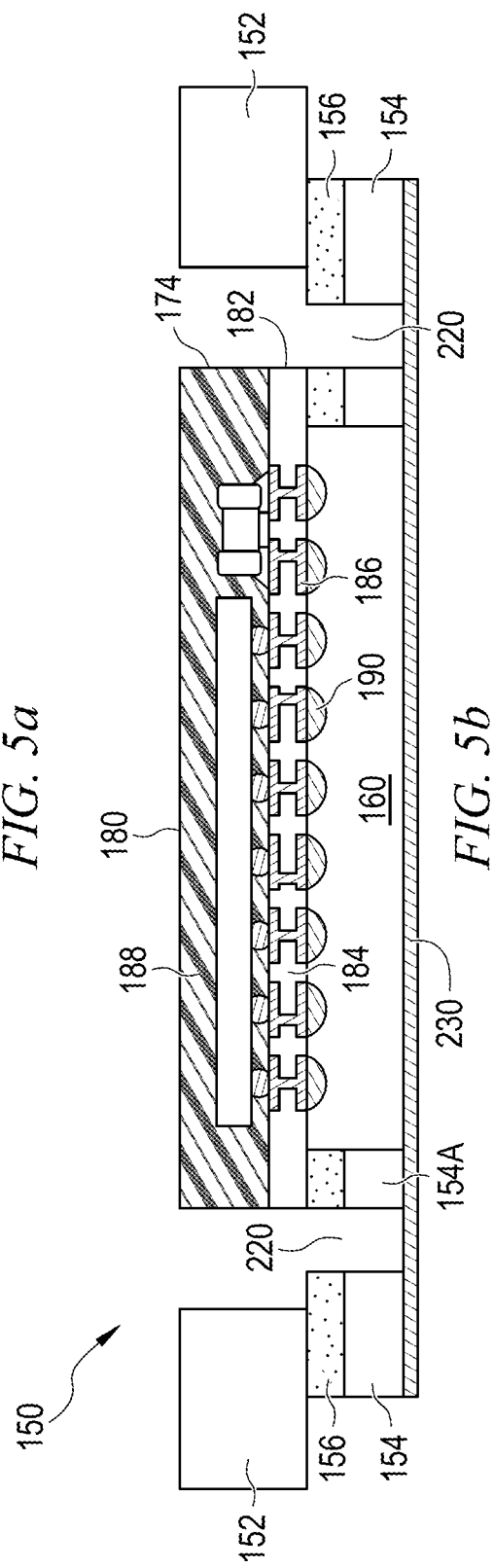
FIG. 5a
FIG. 5b

SEMICONDUCTOR DEVICE AND METHOD FOR REDUCING METAL BURRS USING LASER GROOVING

FIELD OF THE INVENTION

The present invention relates in general to semiconductor devices and, more particularly, to a semiconductor device and method of making a semiconductor device using laser grooving to reduce metal burrs.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, conductive pillars, or other electrical interconnect.

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

One method of forming a semiconductor package, such as the package shown in FIGS. 2a and 2b, involves disposing a singulated semiconductor die 104 over a package substrate 120. One or more discrete components 122 can be disposed over the package substrate with the semiconductor die to provide additional functionality. An encapsulant 124 is deposited over substrate 120, semiconductor die 104, and discrete component 122.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. The shielded components are encapsulated in an insulating molding compound, and then a conductive layer is sputtered onto the molding compound to form a shielding layer around the components. Shielding layers absorb EMI before the signals can affect semiconductor die and discrete components within the package, which might otherwise malfunction. Shielding layers are also formed over packages with components that are expected to generate EMI to protect nearby devices.

FIG. 2a shows a shielding layer 130 being formed over encapsulant 124 to protect semiconductor die 104 from EMI. Substrate 120 is set on a jig 132 with an opening 134 in the jig so that the substrate lies flat even with bumps 136 underneath the substrate. Shielding layer 130 is sputtered over the package to completely cover the top and side surfaces. A portion 130a of the shielding layer extends onto the surrounding jig.

After forming shielding layer 130, the semiconductor package is removed from jig 132 as shown in FIG. 2b. One issue with prior art methods is that portion 130a of the shielding layer peels off the jig and remains attached to the package as a burr. The finished package must be machined, brushed, or otherwise processed to remove the remaining burrs. The burr removal process is an extra processing step that requires complicated mechanisms. Moreover, the loose burrs may stick to components and potentially cause malfunction via inadvertent short circuits. Therefore, a need exists for an improved method and device for forming shielding layers that reduces burr formation.

BRIEF DESCRIPTION OF THE DRAWINGS

FIGS. 3a-3f illustrate forming a shielded semiconductor package with laser grooving to reduce burrs;

FIGS. 4a-4h illustrate additional laser grooving options;

FIGS. 5a and 5b illustrate options for forming the laser grooving completely through the jig.

DETAILED DESCRIPTION OF THE DRAWINGS

Figure 1A:
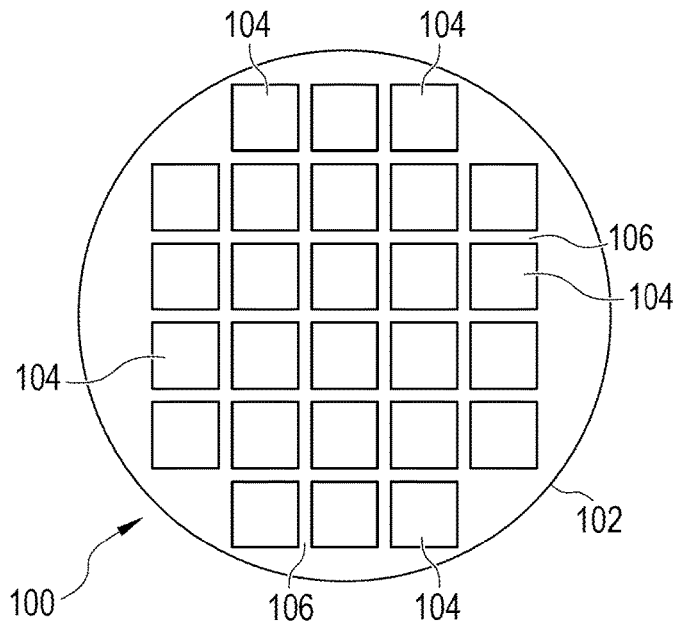
FIGS. 1a-1c illustrate a semiconductor wafer with a plurality of semiconductor die separated by a saw street.
Figure 1B:
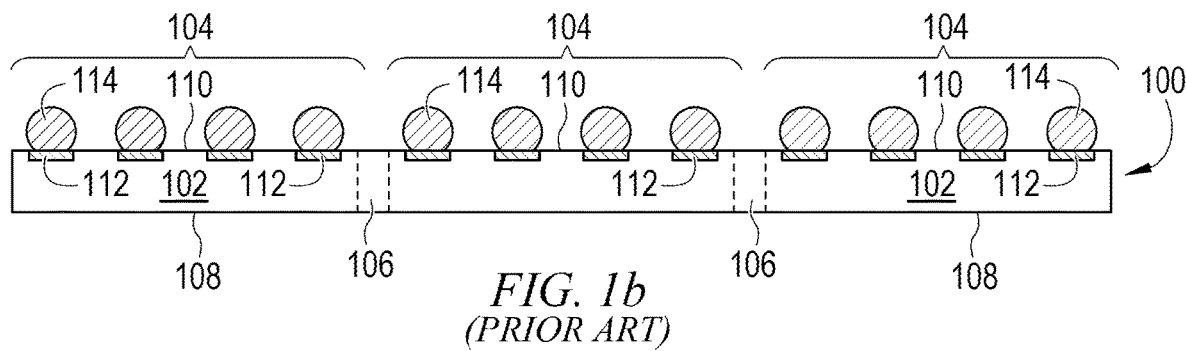
Figure 1C:
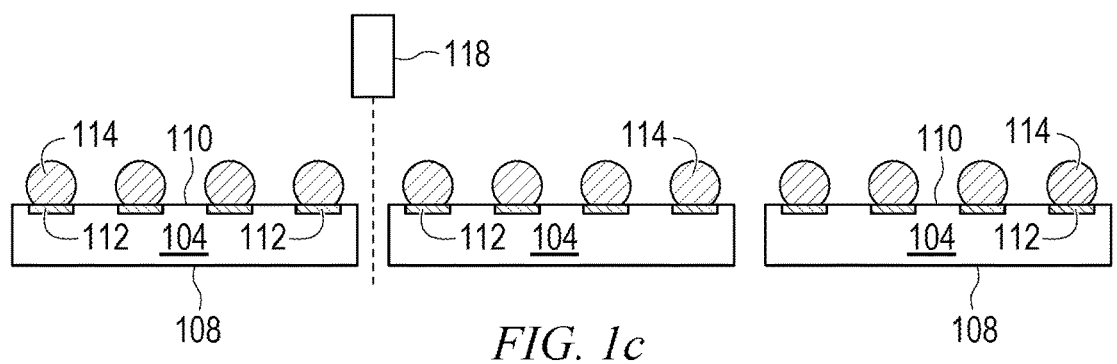
Figure 2A:
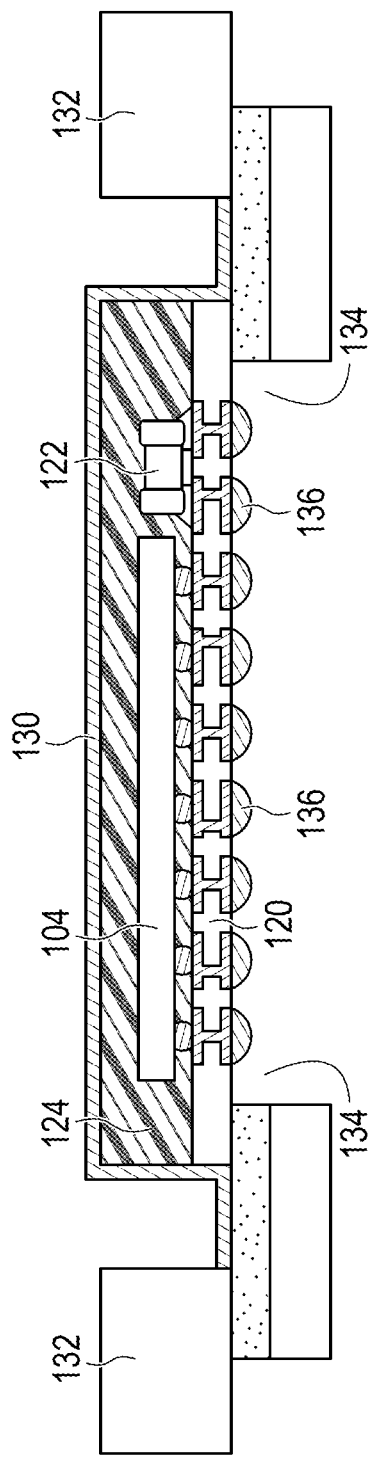
FIGS. 2a and 2b illustrate forming a shielding layer over a semiconductor package.
Figure 2B:
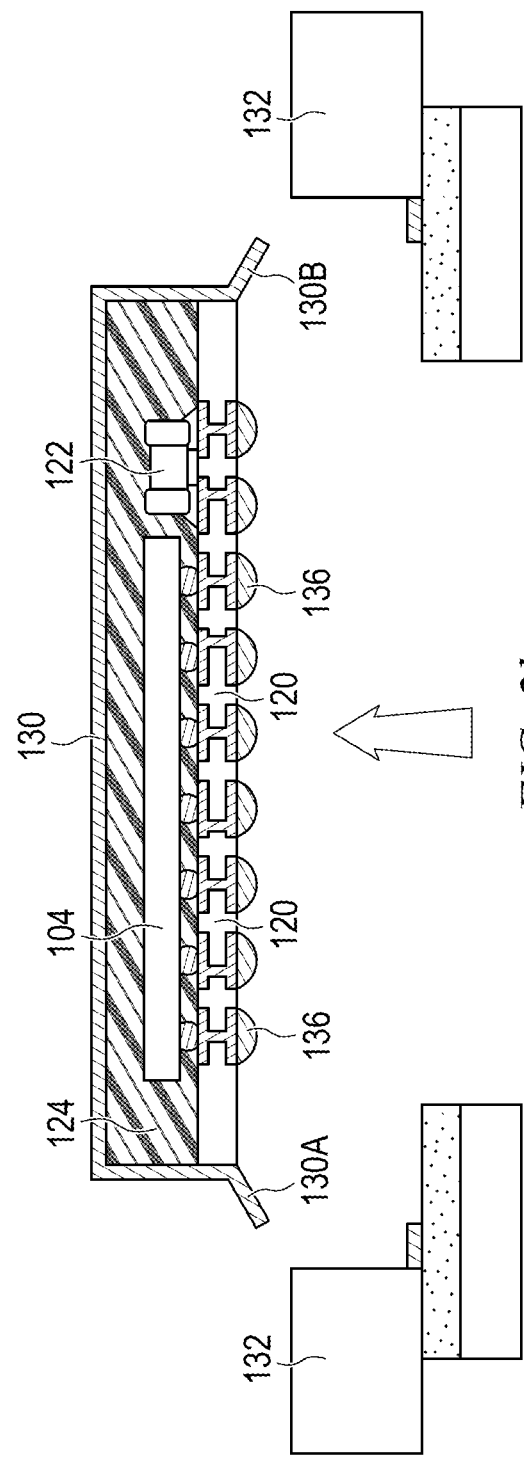

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

FIGS. 3a-3f illustrate forming a shielding layer over a semiconductor package using laser grooving to reduce metal burr production. A jig 150 includes metal frame 152 and polyimide (PI) film 154 attached to the metal frame using a silicone adhesive layer 156. Metal frame 152 can be formed from any suitable material, e.g., aluminum or steel. Non-metal materials, such as wood or plastic, are used in some embodiments. Other types of polymer or non-polymer film or tape can be used for PI film 154. Adhesive layer 156 can be any suitable type of adhesive.

In FIG. 3b, an opening 160 is formed through PI film 154 using a laser, saw, knife, or other type of cutting tool 162. Opening 160 is sized to have a footprint slightly smaller than a package being processed so that the package lies flat on PI film 154 with any interconnect structures of the package extending down through the opening. While a unit-sized jig 150 with only a single opening 160 is shown, in most embodiments the jig is large enough to process tens, hundreds, or thousands of units at once. An opening 160 is formed through PI film 154 for each unit to be processed in parallel. Metal frame 152 can extend between and surround each unit or simply frame the entire jig 150 without extending between units.

In FIG. 3c, a groove 170 is formed into or through adhesive layer 156 surrounding opening 160. Groove 170 can either be continuous completely around opening 160, or the groove can include discrete portions for each side of the opening as shown below in FIG. 5a. Groove 170 is formed using the same cutting tool 162 from FIG. 3b, or a different type of tool can be used. The groove can be formed using a laser, knife, blade, or any other suitable cutting method.

In FIG. 3d, a package 180 to be shielded is disposed on jig 150 over opening 160. Package 180 has a package substrate 182. Substrate 182 includes one or more insulating layers 184 interleaved with one or more conductive layers 186. Insulating layer 184 is a core insulating board in one embodiment, with conductive layers 186 patterned over the top and bottom surfaces, e.g., a copper-clad laminate substrate. Conductive layers 186 also include conductive vias electrically coupled through insulating layers 184. Substrate 182 can include any number of conductive and insulating layers interleaved over each other. A solder mask or passivation layer can be formed over either side of substrate 182. Any suitable type of substrate or leadframe is used for substrate 182 in other embodiments.

Any components desired to implement the intended functionality of packages 180 are mounted to or disposed over substrate 182 and electrically connected to conductive layers 186. FIG. 3d shows semiconductor die 104 and discrete components 122 mounted onto substrate 182 as merely one example. An encapsulant 188 is deposited over substrate 182, semiconductor die 104, and discrete components 122. Conductive bumps 190 are formed or disposed on contact pads of conductive layer 186 in a similar manner to conductive bumps 114 on conductive layer 112 of semiconductor die 104.

Groove 170 is formed with an inner wall 172 positioned to approximately align with side surfaces 174 of package 180. Inner walls 172 of groove 170 and side surfaces 174 of package 180 are coplanar or approximately coplanar.

In FIG. 3e, a conductive material is sputtered over package 180 to form a conductive shielding layer 200. Shielding layer 200 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable conductive material. In some embodiments, shielding layer 200 can be made by sputtering on multiple layers of differing material, e.g., stainless steel-copper-stainless steel or titanium-copper. Shielding layer 200 reduces electromagnetic interference (EMI) between the components of package 180 and other nearby electronic devices. Shielding layer 200 is optionally grounded through conductive layers 186 exposed at a side surface of substrate 182 to improve EMI reduction.

Shielding layer 200 extends down side surfaces 174 of package 180 and into grooves 170. The portions of shielding layer 200 on side surfaces 174 and side walls 172 combine into one uniform vertical span of conductive material. Whereas in the prior art the shielding layer runs down the sides of the package and then immediately makes a 90-degree turn at the jig, groove 170 results in shielding layer 200 extending down side surfaces 174 and then continuing down vertically even below the bottom of package 180.

Figure 3F:
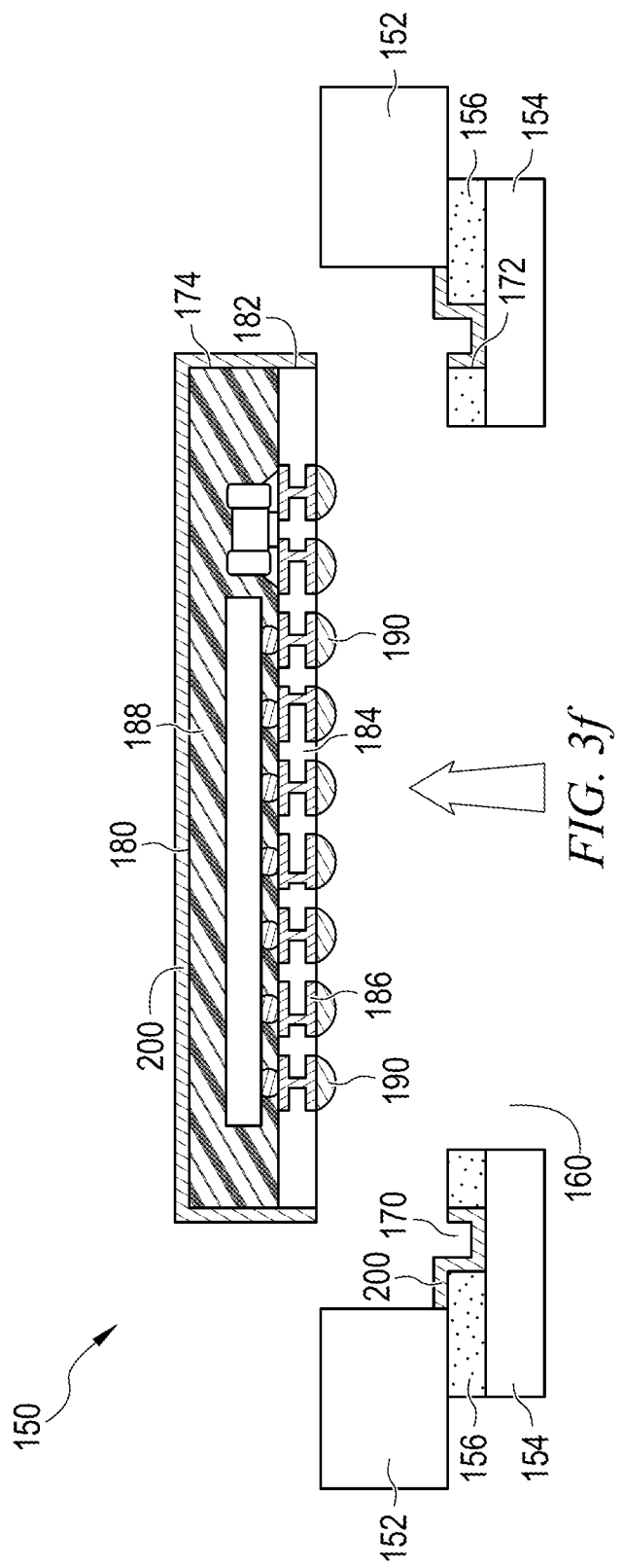

In FIG. 3f, package 180 with shielding layer 200 is removed from jig 150. Shielding layer 200 breaks cleanly along the horizontal line between side surface 174 and side wall 172 as package 180 is lifted. When the package is lifted in the prior art, a horizontal portion of the shielding layer directly adjacent to the package is much more likely to be lifted along with the package compared to shielding layer 200 that continues vertically below package 180.

Figure 4G:
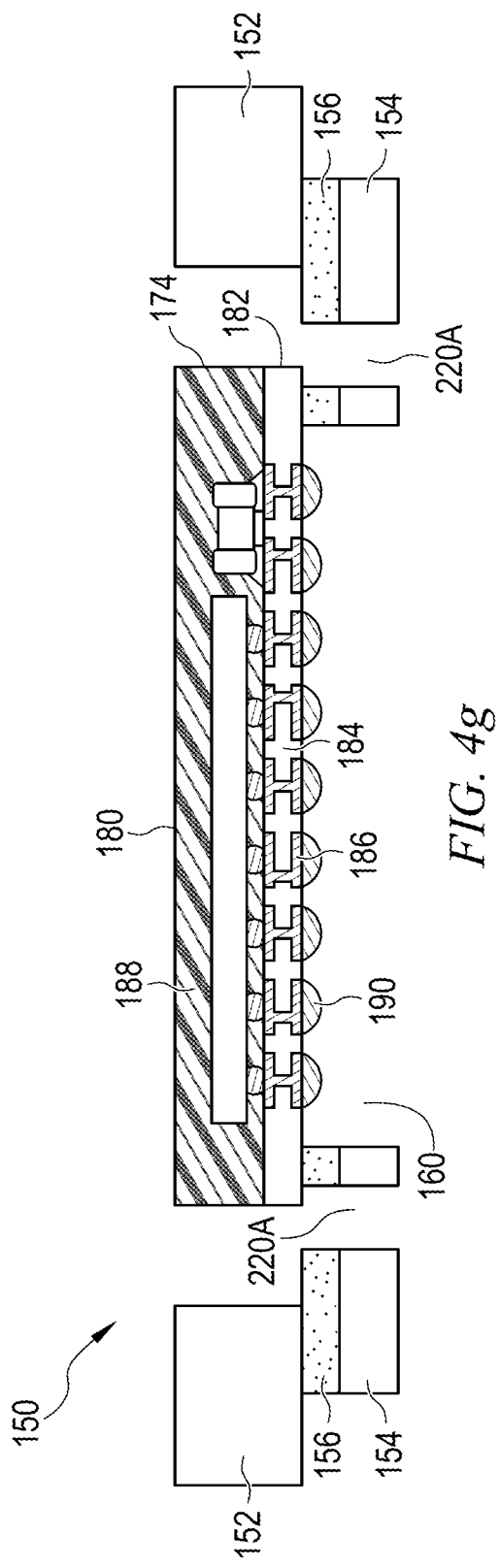

FIGS. 4a-4h illustrate a plurality of other configurations for grooves that reduce burr production. FIG. 4a shows groove 210 extending all the way through adhesive layer 156 and into PI film 154. The sidewall 212 of groove 210 is still approximately coplanar to side surfaces 174 of package 180. Having a deeper groove 210 compared to groove 170 further reduces the likelihood of shielding layer 200 separating from the jig because there is a larger surface area of contact in the same plane as side surface 174. FIG. 4b shows an even deeper groove 220 that extends completely through both adhesive layer 156 and PI film 154. The portion of PI film 154 below package 180 remains connected to the surrounded PI film at the corners of the package as shown in FIG. 5a.

FIGS. 3d, 4a, and 4b show three different options for the depths of a groove to reduce metal burrs. A groove can be formed to any desired depth. FIGS. 4c-4h show different lateral offsets with the three previously shown groove depths. FIGS. 4c and 4d show variations of groove 170 in FIG. 3c. Groove 170a in FIG. 4c extends through adhesive layer 156 as with groove 170. However, groove 170a also extends laterally under package 180. Groove 170b in FIG. 4d is laterally offset from package 180. A portion of adhesive layer 156 remains unaltered between groove 170b and side surface 174. Groove 170b does not extend to or under package 180.

Figure 4H:
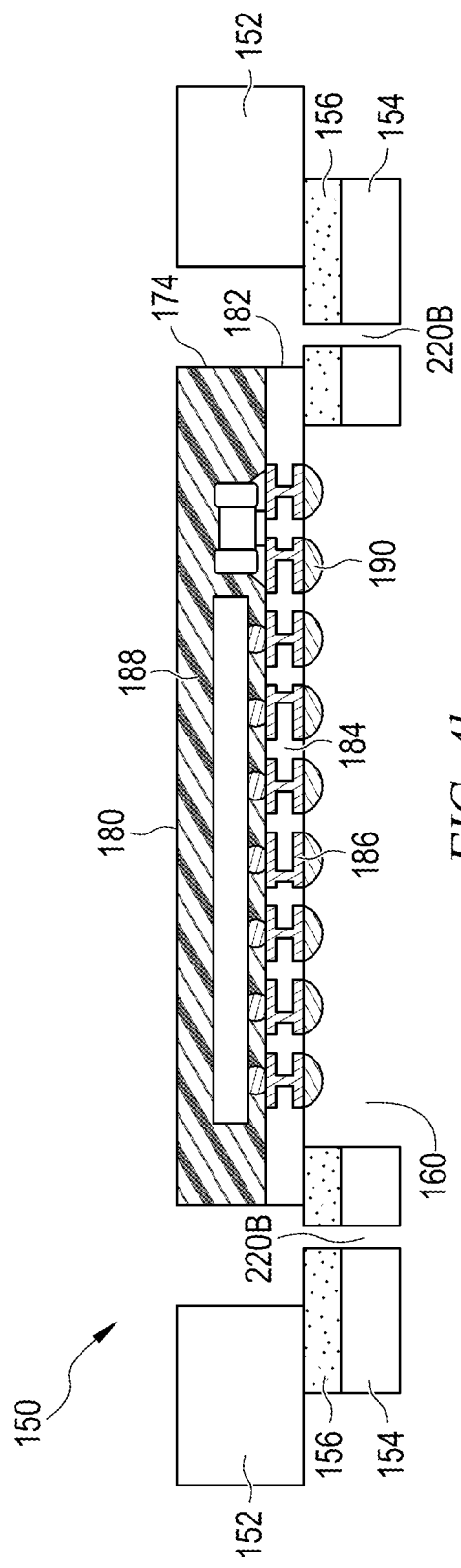

FIGS. 4e and 4f show similar variations as FIG. 4c and FIG. 4d, except for groove 210 in FIG. 4a instead of groove 170. Groove 210a extends under package 180 while groove 210b leaves a separation between the package and groove. Similarly, FIGS. 4g and 4h show variations of groove 220 with groove 220a extending under package 180 and groove 220b leaving separation between package 180 and the groove. The key point is to have a groove in the carrier near the attach area between package 180 and PI film 154. The shielding layer is formed over any desired semiconductor package and into any of the above-described grooves. The grooves aid in tearing the shielding layer near the semiconductor package being shielded so that a large part of the shielding layer is less likely to tear off from jig 150 with the package.

FIGS. 5a and 5b illustrate options for forming grooves 220 completely through both adhesive layer 156 and PI film 154. FIG. 5a shows a plan view of PI film 154 with grooves 220 formed along all four sides of opening 160. Grooves 220 are discontinuous at the corners so that the inner portions 154a of PI film 154 are not completely physically separated. Any of the groove embodiments can be formed in discrete sections for each side or continuously around opening 160.

In FIG. 5b, a thin plate 230 is added under PI film 154 to support the inner portion 154a. Thin plate 230 allows groove 220 to be formed continuously around opening 160 without losing the inner portion 154a of PI film 154 and package 180. Thin plate 230 is a metal plate with an adhesive layer to attach PI film 154. In another embodiment, thin plate 230 is an adhesive tape. Any thickness of thin plate 230 can be used to allow a deeper groove to be formed, including being formed partially through thin plate 230. A groove can be formed completely through thin plate 230 if the inner portions remain connected at the corners as in FIG. 5a.

Figure 6A:
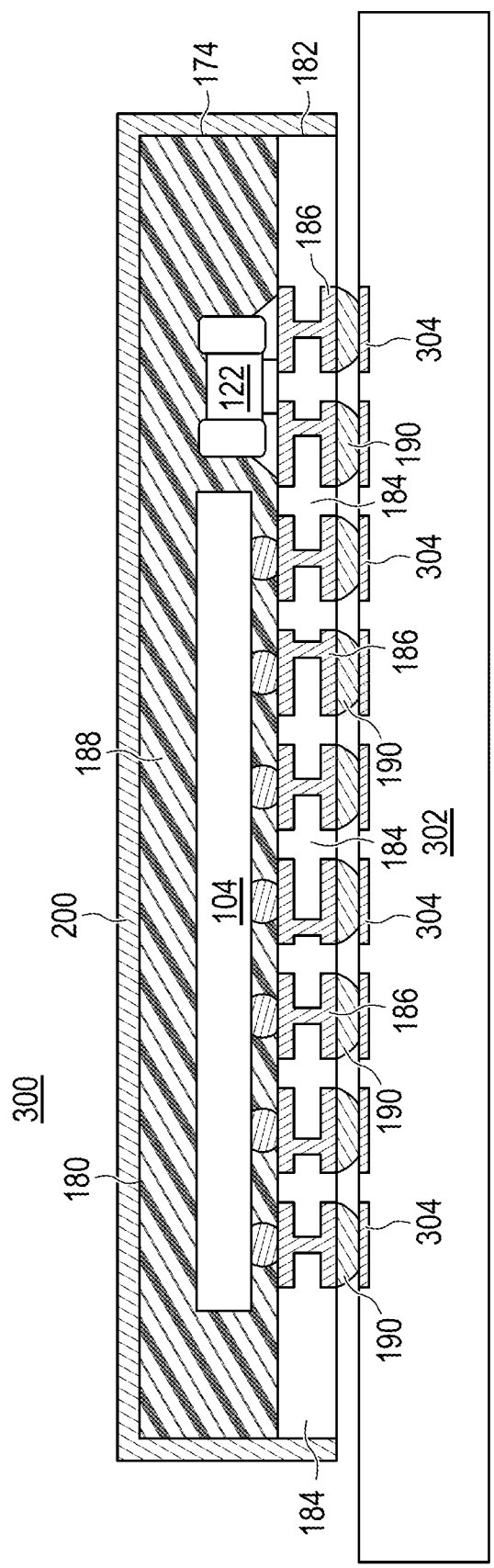
FIGS. 6a and 6b illustrate integrating the shielded packages into an electronic device.
Figure 6B:
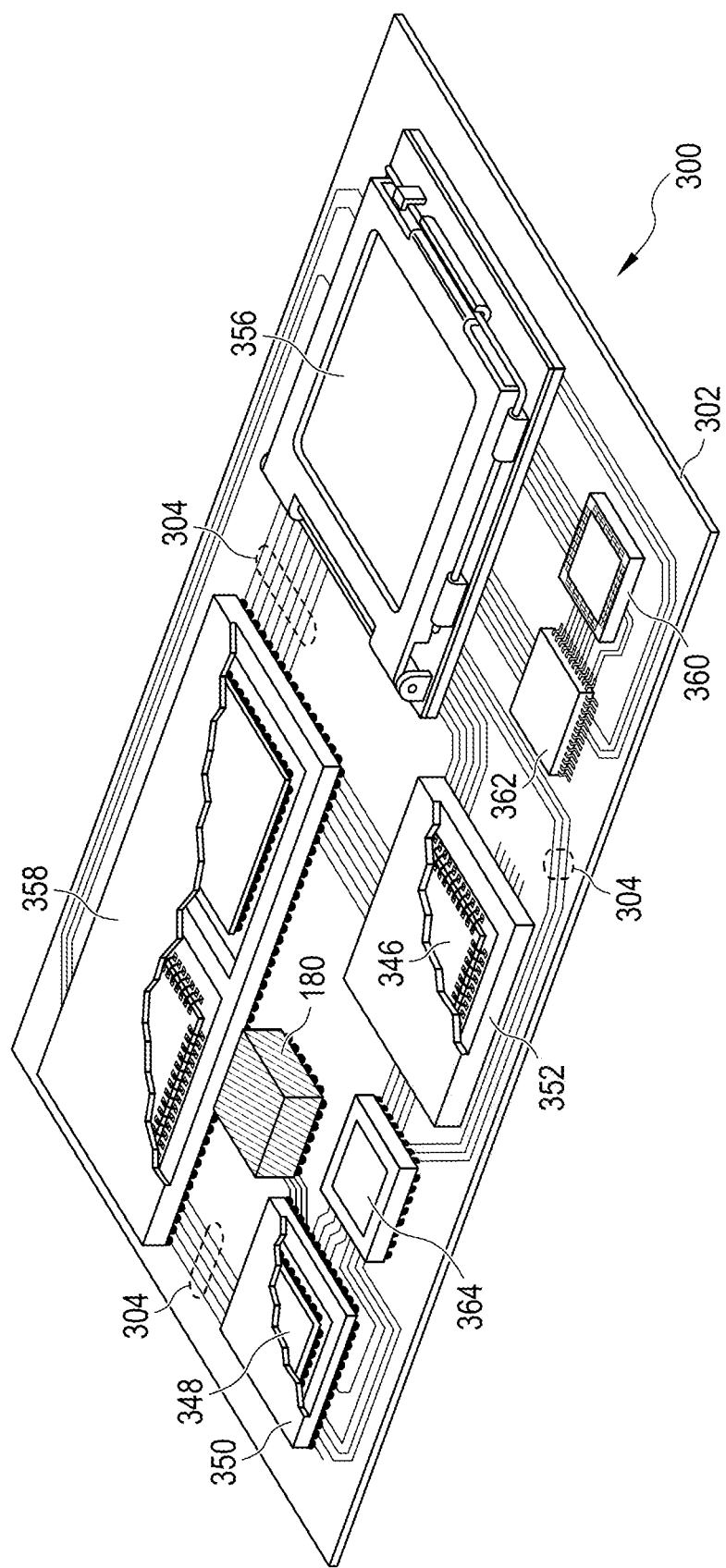

FIGS. 6a and 6b illustrate incorporating the above-described shielded semiconductor packages, e.g., package 180 with shielding layer 200, into an electronic device 300. FIG. 6a illustrates a partial cross-section of package 180 mounted onto a printed circuit board (PCB) or other substrate 302 as part of electronic device 300. Bumps 190 are reflowed onto conductive layer 304 of PCB 302 to physically attach and electrically connect package 180 to the PCB. In other embodiments, thermocompression or other suitable attachment and connection methods are used. In some embodiments, an adhesive or underfill layer is used between package 180 and PCB 302. Semiconductor die 104 is electrically coupled to conductive layer 304 through substrate 182 and bumps 190.

FIG. 6b illustrates electronic device 300 including PCB 302 with a plurality of semiconductor packages mounted on a surface of the PCB, including package 180. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 6b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purposes of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with package 180. Conductive traces 304 electrically couple the various packages and components disposed on PCB 302 to package 180, giving use of the components within package 180 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a jig including a metal frame, a polymer film, and an adhesive layer disposed between the metal frame and polymer film;
   forming an opening through the adhesive layer and polymer film;
   forming a groove in the adhesive layer and polymer film around the opening;
   disposing a semiconductor package on a top surface of the adhesive layer of the jig over the opening with a portion of the top surface remaining exposed between a side surface of the semiconductor package and the groove, wherein the groove is formed in the adhesive layer and polymer film prior to disposing the semiconductor package on the adhesive layer;
   forming a shielding layer over the semiconductor package and jig, wherein a portion of the shielding layer extends into the groove; and
   removing the semiconductor package from the jig after forming the shielding layer, wherein the portion of the shielding layer remains in the groove.

2. The method of claim 1, further including removing the semiconductor package from the jig.

3. The method of claim 1, further including forming the groove extending into the polymer film.

4. The method of claim 1, further including forming the groove extending completely through the adhesive layer and polymer film.

5. The method of claim 1, further including forming the shielding layer by sputtering to coat a side surface of the adhesive layer in the groove without completely filling the groove.

6. A method of making a semiconductor device, comprising:
   providing a jig including a polymer film and an adhesive layer disposed on the polymer film;
   forming a groove completely through the polymer film and adhesive layer, wherein the groove is formed with a plurality of discrete and separate portions with one of the portions along each edge of the semiconductor package;
   disposing a semiconductor package on the jig with a side surface of the semiconductor package adjacent to the groove;
   forming a shielding layer over the semiconductor package and jig; and
   removing the semiconductor package from the jig after forming the shielding layer.

7. The method of claim 6, further including disposing the semiconductor package with an edge of the semiconductor package within a footprint of the groove, wherein the semiconductor package includes a flat bottom surface physically contacting the adhesive layer with a portion of the flat bottom surface exposed within the groove.

8. The method of claim 6, further including disposing the semiconductor package with a lateral gap between the groove and semiconductor package, wherein a first portion of a top surface of the adhesive layer is exposed within the lateral gap, and wherein a second portion of the top surface of the adhesive layer physically contacts the semiconductor package.

9. The method of claim 6, further including disposing a flat plate on the polymer film opposite the adhesive layer.

10. The method of claim 9, further including disposing the flat plate extending over the groove.

11. The method of claim 6, further including disposing the semiconductor package on the jig after forming the groove completely through the polymer film and adhesive layer.

12. A method of making a semiconductor device, comprising:
   providing a jig;
   forming a groove completely through the jig;
   disposing a semiconductor package over the jig with a side surface of the semiconductor package adjacent to the groove, wherein the groove is formed completely through the jig prior to disposing the semiconductor package over the jig; and
   forming a shielding layer over the semiconductor package and jig, wherein a portion of the shielding layer extends into the groove.

13. The method of claim 12, further including removing the semiconductor package from the jig.

14. The method of claim 12, further including disposing the semiconductor package with an edge of the semiconductor package within a footprint of the groove, wherein the semiconductor package includes a flat bottom surface physically contacting the adhesive layer with a portion of the flat bottom surface exposed within the groove.

15. The method of claim 12, further including disposing the semiconductor package with a lateral gap between the groove and semiconductor package, wherein a first portion of a top surface of the adhesive layer is exposed within the lateral gap, and wherein a second portion of the top surface of the adhesive layer physically contacts the semiconductor package.

16. The method of claim 12, further including disposing a flat plate on the jig opposite the semiconductor package.

17. The method of claim 16, further including disposing the flat plate extending over the groove.

18. The method of claim 12, further including forming the groove with discrete and separate portions along each respective edge of the semiconductor package.

19. A method of making a semiconductor device, comprising:
providing a metal frame;
disposing an adhesive layer over the metal frame, wherein the adhesive layer overlaps a footprint of the metal frame, and wherein the adhesive layer is in direct physical contact with the metal frame;
disposing a polymer film over the adhesive layer, wherein the adhesive layer is disposed between the polymer film and metal frame, wherein the polymer film is attached to the metal frame by the adhesive layer, and wherein an edge of the polymer film and an edge of the adhesive layer are aligned;
forming an opening through the adhesive layer and polymer film; and
forming a groove completely through the adhesive layer and polymer film around the opening.

20. The method of claim 19, further including disposing a semiconductor package over the opening with a side surface of the semiconductor package oriented in parallel with the groove, wherein the groove is formed prior to disposing the semiconductor package over the opening.

21. The method of claim 20, further including disposing the semiconductor package with an edge of the semiconductor package within a footprint of the groove, wherein the semiconductor package includes a flat bottom surface physically contacting the adhesive layer with a portion of the flat bottom surface exposed within the groove.

22. The method of claim 20, further including disposing the semiconductor package with a lateral gap remaining between the groove and semiconductor package, wherein a first portion of a top surface of the adhesive layer is exposed within the lateral gap, and wherein a second portion of the top surface of the adhesive layer physically contacts the semiconductor package.

* * * * *